(12) United States Patent
Sun et al.

(10) Patent No.: US 10,680,596 B1
(45) Date of Patent: Jun. 9, 2020

(54) BOOTSTRAPPED SWITCH CIRCUIT WITH IMPROVED SPEED

(71) Applicant: QUALCOMM Incorporated, San Diego, CA (US)

(72) Inventors: Lei Sun, San Diego, CA (US); Ganesh Kiran, San Diego, CA (US); Seyed Arash Mirhaj, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/399,630

(22) Filed: Apr. 30, 2019

Related U.S. Application Data (60) Provisional application No. 62/786,206, filed on Dec. 28, 2018.

(51) Int. Cl.
  *H02M 1/08* (2006.01)
  *H03K 17/041* (2006.01)
  *H04M 1/02* (2006.01)

(52) U.S. Cl.
  CPC ..... *H03K 17/04106* (2013.01); *H04M 1/0202* (2013.01)

(58) Field of Classification Search
  CPC .... H02M 1/08; H02M 3/158; H02M 3/33507; H02M 2001/0009
  See application file for complete search history.

(56) References Cited

U.S. PATENT DOCUMENTS

| | | | |
|---|---|---|---|
| 2012/0262316 A1* | 10/2012 | Strode | H03M 1/162 341/110 |
| 2014/0266392 A1* | 9/2014 | Devarajan | H03K 17/04 327/376 |
| 2016/0027528 A1 | 1/2016 | Verbruggen et al. | |
| 2018/0076808 A1* | 3/2018 | Singer | H03K 17/005 |

OTHER PUBLICATIONS

International Search Report and Written Opinion—PCT/US2019/059232—ISA/EPO—dated Jan. 27, 2020.

* cited by examiner

*Primary Examiner* — Sibin Chen
(74) *Attorney, Agent, or Firm* — Haynes and Boone, LLP (57) ABSTRACT

A bootstrapped switch circuit includes an auxiliary loop circuit for assisting the boosting of a bootstrap voltage in a main loop circuit having a bootstrapped switch transistor. The boosted bootstrap voltage switches on the bootstrapped switch transistor so that an input voltage signal may conduct through the bootstrapped switch transistor to charge a sampling node.

12 Claims, 7 Drawing Sheets

```
┌─────────────────────────────────────────────────────────────┐
│ in an auxiliary loop circuit, switching on a replica first  │
│ loop transistor to couple a positive terminal of a replica  │── 300
│ bootstrap capacitor to a gate of a replica second loop      │
│ transistor to switch on the replica second loop transistor  │
└─────────────────────────────────────────────────────────────┘
                              │
                              ▼
┌─────────────────────────────────────────────────────────────┐
│ responsive to the switching on of the second loop           │
│ transistor, coupling an input voltage signal to a negative  │
│ terminal of the replica bootstrap capacitor to boost a      │── 305
│ replica bootstrap voltage at the gate of the replica        │
│ second loop transistor                                      │
└─────────────────────────────────────────────────────────────┘
                              │
                              ▼
┌─────────────────────────────────────────────────────────────┐
│ in a main loop circuit, switching on a second loop          │
│ transistor responsive to the boosting of the replica        │── 310
│ bootstrap voltage to assert a bootstrap voltage at a gate   │
│ of a bootstrapped switch transistor                         │
└─────────────────────────────────────────────────────────────┘
                              │
                              ▼
┌─────────────────────────────────────────────────────────────┐
│ responsive to the assertion of the bootstrap voltage,       │
│ switching on the bootstrapped switch transistor to sample   │── 315
│ the input voltage signal at a sampling node                 │
└─────────────────────────────────────────────────────────────┘
```

BOOTSTRAPPED SWITCH CIRCUIT WITH IMPROVED SPEED

RELATED APPLICATION

The present application claims the benefit of U.S. Provisional Patent Application No. 62/786,206, filed Dec. 28, 2018, which is incorporated by reference herein.

TECHNICAL FIELD

This application relates to bootstrapped switches, and more particularly to a bootstrapped switch with improved switching speed.

BACKGROUND

The gate-to-source voltage for a field effect transistor affects the transistor's on-resistance. To achieve constant conductance operation, the gate-to-source voltage should be held constant while the transistor is on as practiced by a bootstrapped switch circuit having a bootstrapped switch transistor used to sample an input voltage. Prior to a sampling period, a positive terminal of a bootstrap capacitor is charged to a power supply voltage with respect to a negative terminal of the bootstrap capacitor. During the sampling period, a loop circuit is formed by the switching on of a pair of loop transistors in the bootstrapped switch circuit. One of the loop transistors allows the input voltage to flow to the negative terminal of the bootstrap capacitor. Since the bootstrap capacitor was already charged to the power supply voltage, the positive terminal voltage is boosted to the power supply voltage plus the input voltage (ignoring any losses). This elevated voltage may be denoted as the bootstrapped voltage.

The switching on of a remaining one of the loop transistors allows the bootstrapped voltage to charge the gate of the bootstrapped switch transistor. The gate-to-source voltage for the bootstrapped switch transistor thus stays approximately equal to the power supply voltage. In this fashion, the bootstrapped switch circuit can accurately sample the input voltage due to the constant conductance operation despite variations in the input voltage.

The gate of the bootstrapped switch transistor may have a relatively high amount of parasitic (loading) capacitance. This capacitance slows the switching on (the activation) of the loop circuit. When the sampling period is over, this same capacitance slows the deactivation of the loop circuit. The resulting loading slows the sampling speed of the input voltage.

Accordingly, there is a need in the art for bootstrap switch circuits with improved switching speeds.

SUMMARY

A bootstrapped switch circuit is provided with a main loop circuit and an auxiliary loop circuit. The main loop circuit forms a first loop through a first loop transistor, a bootstrap capacitor, a second loop transistor, and a bootstrapped switch transistor. In this first loop, the second loop transistor controls whether an input voltage can charge a negative terminal of the bootstrap capacitor during a sampling period for the input voltage. Prior to the sampling period, a positive terminal voltage for the bootstrap capacitor was charged to a power supply voltage with respect to the negative terminal voltage. The switching on of the second loop transistor thus causes the positive terminal voltage to be boosted to the bootstrap voltage (a sum of the power supply voltage and the input voltage). At the beginning of the sampling period, the first loop transistor switches on so that the bootstrap voltage charges a gate of the bootstrapped switch transistor to switch on the bootstrapped switch transistor during the sampling period. The switching on of the bootstrapped switch transistor allows the input voltage to charge a sampling node during the sampling period.

The bootstrap voltage does not control the switching of the second loop transistor. Instead, it is the auxiliary loop circuit that switches on the second loop transistor. The auxiliary loop circuit includes a replica of the main loop circuit to generate a replica bootstrap voltage at the start of the sampling period. It is this replica bootstrap voltage that drives a gate of the second loop transistor to control the switching of the second loop transistor to ultimately increase the turn-on speed for the bootstrapped switch transistor.

To increase the turn-off speed for the bootstrapped switch transistor, the main loop circuit may include a third loop transistor coupled between the first loop transistor and the gate of the bootstrapped switch transistor. The third loop transistor is configured to switch off at the end of the sampling period to isolate the gate voltage of the bootstrapped switch from the bootstrap voltage at the positive terminal of the bootstrap capacitor. Alternatively, the replica bootstrap voltage may be discharged to switch off the second loop transistor to increase the turn-off speed for the bootstrapped switch transistor.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To improve the operating speed for a bootstrapped switch circuit, the bootstrapped switch circuit is provided with a main loop circuit and an auxiliary loop circuit. In the main loop circuit, a node for an input voltage couples through a second loop transistor to a negative terminal of the bootstrap capacitor. A positive terminal of the bootstrap capacitor couples through a first loop transistor to drive a gate of a bootstrapped switch transistor with a bootstrap voltage during a sampling period for an input voltage. To reduce a turn-on time for the bootstrapped switch transistor during the sampling period, the bootstrap voltage does not control a switching of the second loop transistor. Instead, it is the auxiliary loop circuit that controls a switching of the second loop transistor.

The auxiliary loop circuit is a modified duplicate of the main loop circuit. The auxiliary loop circuit includes a replica bootstrap capacitor, a replica first loop transistor, and a replica second loop transistor but does not include a replica of the bootstrapped switch transistor. Analogous to the main loop circuit, a positive terminal of the replica bootstrap capacitor connects through the replica first loop transistor to output a replica bootstrap voltage during the sampling period. But this replica bootstrap voltage is not loaded by any bootstrapped switch transistor such as in the main loop circuit. Instead, the replica bootstrap voltage drives a gate of the replica second loop transistor. Analogous to the main loop circuit, a node for the input voltage in the auxiliary loop circuit couples through the replica second loop transistor to the negative terminal of the replica bootstrap capacitor during the sampling period for the input voltage. Since the auxiliary loop circuit is not loaded by the bootstrapped switch transistor, the auxiliary loop circuit can quickly switch on the replica second loop transistor at the onset of the sampling period. The replica bootstrap voltage is thus quickly boosted to the desired sum of the input voltage and a power supply voltage during the sampling period. This is quite advantageous since it is the replica bootstrap voltage that drives the gate of the first second transistor in the main loop circuit. The rapid boost of the replica bootstrap voltage in the auxiliary loop circuit thus increases the turn-on speed for the second loop transistor in the main loop circuit. In turn, this increase in speed for the switching on of the second loop transistor increases the speed for the boosting of the bootstrap voltage to increase the turn-on speed for the bootstrapped switch transistor.

In some implementations, the main loop circuit includes a third loop transistor coupled between the first loop transistor and the gate of the bootstrapped switch transistor. An internal clock buffer voltage for a clock buffer controls the third loop transistor to switch it off near the end of the sampling period. The clock buffer may then more quickly discharge the bootstrap voltage to end the sampling period. These implementations will now be discussed in more detail.

Figure 1A:
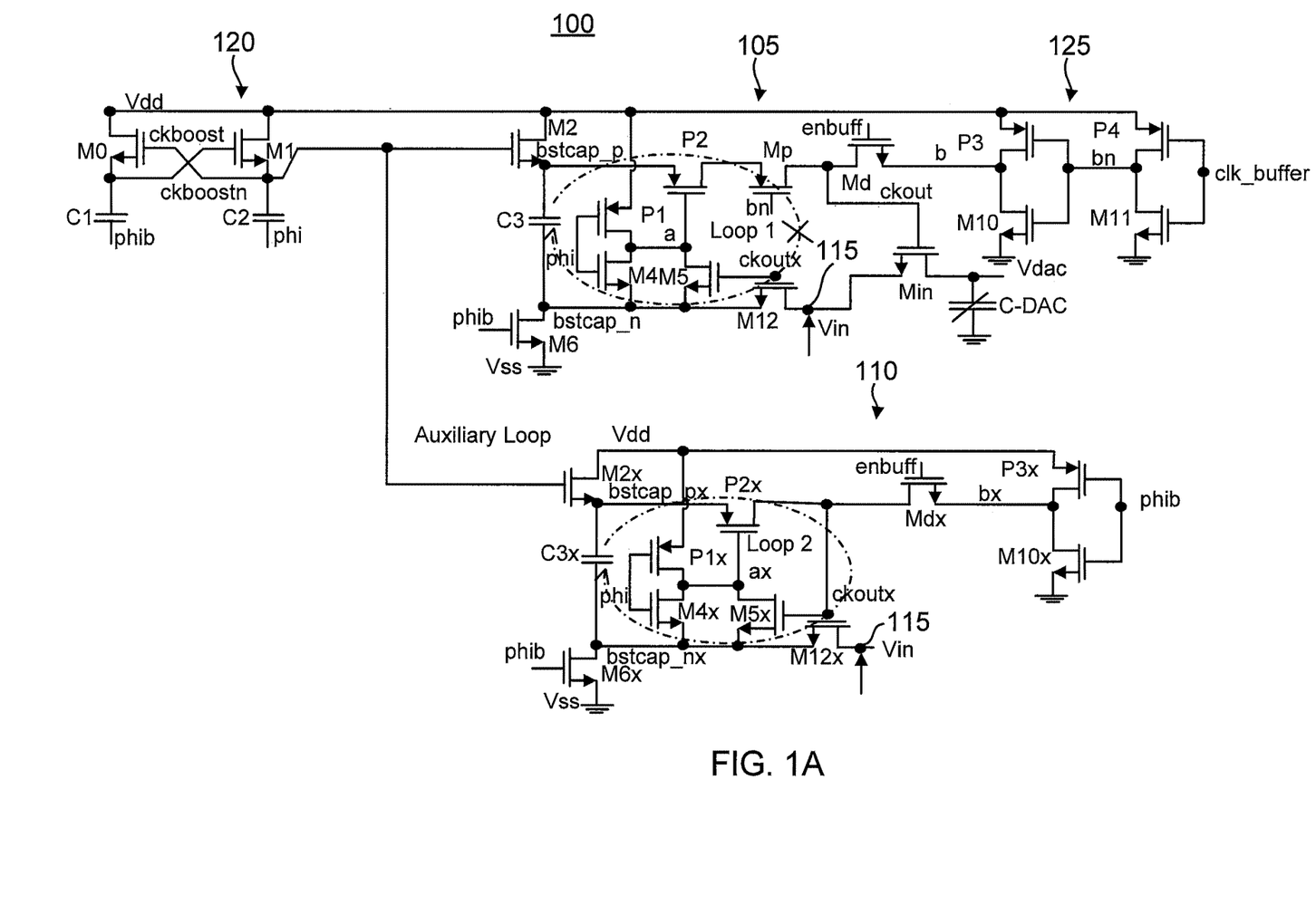
FIG. 1A illustrates a first improved bootstrapped switch circuit in accordance with an aspect of the disclosure.

An improved bootstrapped switch circuit 100 is shown in FIG. 1A that includes a main loop circuit 105 and an auxiliary loop circuit 110. Main loop circuit 105 includes an n-type metal-oxide semiconductor (NMOS) second loop transistor M12 having a drain connected to a node 115 for an input voltage Vin and a source connected to a negative terminal for a bootstrap capacitor C3. During a sampling period, auxiliary loop circuit 110 asserts a gate voltage ckoutx (a replica bootstrap voltage) for second loop transistor M12 to switch second loop transistor M12 on as will be explained further herein so that the input voltage signal conducts through second loop transistor M12 to charge the negative terminal of bootstrap capacitor C3.

The sampling period occurs while a clock signal phi is asserted. A complement clock signal phib controls a gate for an NMOS transistor M6 that has its source tied to ground and a drain connected to the negative terminal of bootstrap capacitor C3 so that transistor M6 is switched on to ground the negative terminal voltage (designated as bstcap_n) of bootstrap capacitor C3 while the clock signal phi is low. A switched capacitor circuit 120 formed by a pair of NMOS transistors M0 and M1 and a pair of capacitors C1 and C2 control the timing for the charging of bootstrap capacitor C3 responsive to the clock signal phi and its complement clock signal phib.

Switched capacitor circuit 120 controls the charging of bootstrap capacitor C3 by controlling whether an NMOS transistor M2 conducts. The drain of transistor M2 is tied to a power supply node for the power supply voltage VDD and its source is tied to the positive terminal of bootstrap capacitor C3. The assertion of the complement clock signal phib causes switch capacitor circuit 105 to charge the gate of transistor M2 to twice the power supply voltage VDD to switch transistor M2 on so that the positive terminal voltage (designated as bstcap_p) of bootstrap capacitor C3 is charged to the power supply voltage VDD. When the complement clock signal phib falls low, both transistors M2 and M6 switch off.

The switching on of second loop transistor M12 during the sampling period while the clock signal phi is asserted causes the negative terminal voltage bstcap_n to be raised to the input voltage Vin so that the positive terminal voltage signal bstcap_p rises to a sum of the power supply VDD and the input voltage Vin. A p-type metal-oxide semiconductor (PMOS) first loop transistor P2 controls whether the positive terminal voltage signal bstcap_p charges the bootstrap voltage ckout. To control the switching of first loop transistor P2, a serial combination of a PMOS transistor P1 and an NMOS transistor M4 control a voltage for a node a connected to the gate for first loop transistor P2. The clock signal phi drives the gates of transistors P1 and M4 so that transistor P1 is switched on when the clock signal phi is low. Since the source of transistor P1 is tied to the power supply node, the node voltage a will be charged to the power supply voltage VDD when the clock signal phi is low, which switches off first loop transistor P2. When the clock signal phi is asserted high to begin the sampling period, transistor M4 switches on to couple node a to the cathode for bootstrap capacitor C3. Since the negative terminal voltage bstcap_n had been grounded while the clock signal phi was low, first loop transistor P2 will switch on during the sampling period. To assist the switching on of first loop transistor P2, main loop circuit 105 may also include an NMOS transistor M5 having a source tied to the negative terminal of bootstrap capacitor C3 and a drain connected to the gate of first loop transistor P2. The replica bootstrap voltage ckoutx drives the gate of transistor M5. As will be explained further herein, the replica bootstrap voltage ckoutx is asserted during the sampling period so that transistor M5 assists in the grounding of the gate of first loop transistor P2 during the sampling period to further assist in the switching on of first loop transistor P2.

Main loop circuit 105 also includes a third loop PMOS transistor Mp having a source connected to the drain of first loop transistor P2 and a drain connected to the gate of bootstrapped switch transistor Min. A clock signal bn controls the gate of third loop transistor Mp so that third loop transistor Mp is switched on during the sampling period as will be explained further herein. With the first and third loop transistors P2 and Mp switched on, the positive terminal voltage signal bstcap_p charges the bootstrap voltage ckout. The gate of bootstrapped switch transistor Min is thus charged to a sum of the power supply voltage Vdd and the input voltage Vin (ignoring any losses) during the sampling period for the input voltage Vin while the clock signal phi is asserted high. Bootstrapped switch transistor Min has a drain connected to node 115 for the input voltage Vin and a source connected to a sampling node such as a node Vdac for a digital-to-analog converter (DAC) having a variable DAC capacitor C-DAC. The switching on of bootstrapped switch transistor Min during the sampling period thus allows the input voltage Vin to charge the capacitor C-DAC to a sampled voltage Vdac so that the input voltage Vin may be sampled accordingly by the DAC (not illustrated).

In auxiliary loop circuit 110, the bootstrap capacitor C3 is replicated as a replica bootstrap capacitor C3x. Auxiliary loop circuit 110 boosts replica bootstrap ckoutx analogously as discussed with regard to the boosting of bootstrap voltage ckout. A replica transistor M6x in auxiliary loop circuit 110 thus replicates the action of transistor M6 in main loop circuit 105 so that a negative terminal voltage (bstcap_nx) of replica bootstrap capacitor C3x is grounded while the complement clock signal phib is asserted. Similarly, a replica transistor M2x in auxiliary loop circuit 110 replicates the action of transistor M2 in main loop circuit 105 so that a positive terminal voltage (bstcap_px) of replica bootstrap capacitor C3x is charged to the power supply voltage VDD while the complement clock signal phib is asserted. Auxiliary loop 110 also includes a replica first loop transistor P2x that has a source connected to the positive terminal of replica bootstrap capacitor C3x to replicate the action of first loop transistor P2 in main loop circuit 105. But note that the drain of replica first loop transistor P2x connects directly to a gate of a replica second loop transistor M12x.

Replica transistors P1x, M4x, and M5x in auxiliary loop circuit 110 replicate the action of transistors P1, M4, and M5 in main loop circuit 105 so that replica first loop transistor P2x is switched on in response to the assertion of the clock signal phi. Given the direct connection between the drain of replica first loop transistor P2x and the gate of replica second loop transistor M12x, replica second loop transistor M12x switches on quickly since there is no capacitive loading from the bootstrapped switch transistor Min. The replica bootstrap voltage ckoutx is thus quickly boosted during the sampling period. In turn, this rapid boosting of the replica bootstrap voltage ckoutx ensures a rapid switching on of second loop transistor M12 in main loop circuit 105. The boosting speed of the bootstrap voltage ckout in main loop circuit 105 is thus enhanced, which enhances the sampling speed of the input voltage Vin.

Although transistors M2x, M4x, M5x, M6x, M12x, P1x, and P2x are designated as replicas of their corresponding transistors in main loop circuit 105, note that these replica transistors may be sized to be smaller than their counterparts in main loop circuit 105 to further decrease the loading and increase the speed of boosting replica bootstrap voltage ckoutx. Although auxiliary loop circuit 110 advantageously increases the switching speed for bootstrapped switch circuit 100, note that there is a possibility that the replica bootstrap voltage ckoutx could kick back and pollute the input voltage Vin at the end of the sampling period. The bootstrap voltage ckout may thus be switched off sooner than the replica bootstrap voltage ckoutx at the end of the sampling period. To assist this timing, a buffered version of an input clock signal clkin is produced using a pair of inverters as shown in a clock buffer 130 of FIG. 1B to produce a buffered clock signal clk_buffer. It is this buffered clock signal clk_buffer that drives a clock buffer 125 in main loop circuit 105.

Clock buffer 125 includes a serial combination of a PMOS transistor P4 and an NMOS transistor M1l that forms a first inverter to invert the buffered clock signal clk_buffer into an inverted clock signal bn. It is this inverted clock signal bn that drives the gate of third loop transistor Mp to switch third loop transistor Mp on during the sampling period. Clock buffer 125 includes a second inverter formed by a serial combination of a PMOS transistor P3 and a NMOS transistor M10 for inverting the inverted clock signal bn into a second buffered clock signal carried on a node b. Node b couples through a dummy NMOS transistor Md to the gate of bootstrapped switch transistor Min. A default-high buffer signal enbuff drives the gate of dummy transistor Md to keep it on during normal operation.

Referring again to FIG. 1B, a clock signal generator 135 provides the appropriate timing for clock signal phi and its (non-overlapping) complement clock signal phib. In clock signal generator 135, an AND gate 140 ANDs the input clock signal clkin and a delayed version of the input clock signal clkin to produce a delayed complement version of the input clock signal clkin. The input clock signal clkin and the delayed complement version of the input clock signal clkin drive a pair of cross-coupled NAND gates 145 and 150 to produce the clock signal phi and its complement clock signal phib.

Figure 1B:
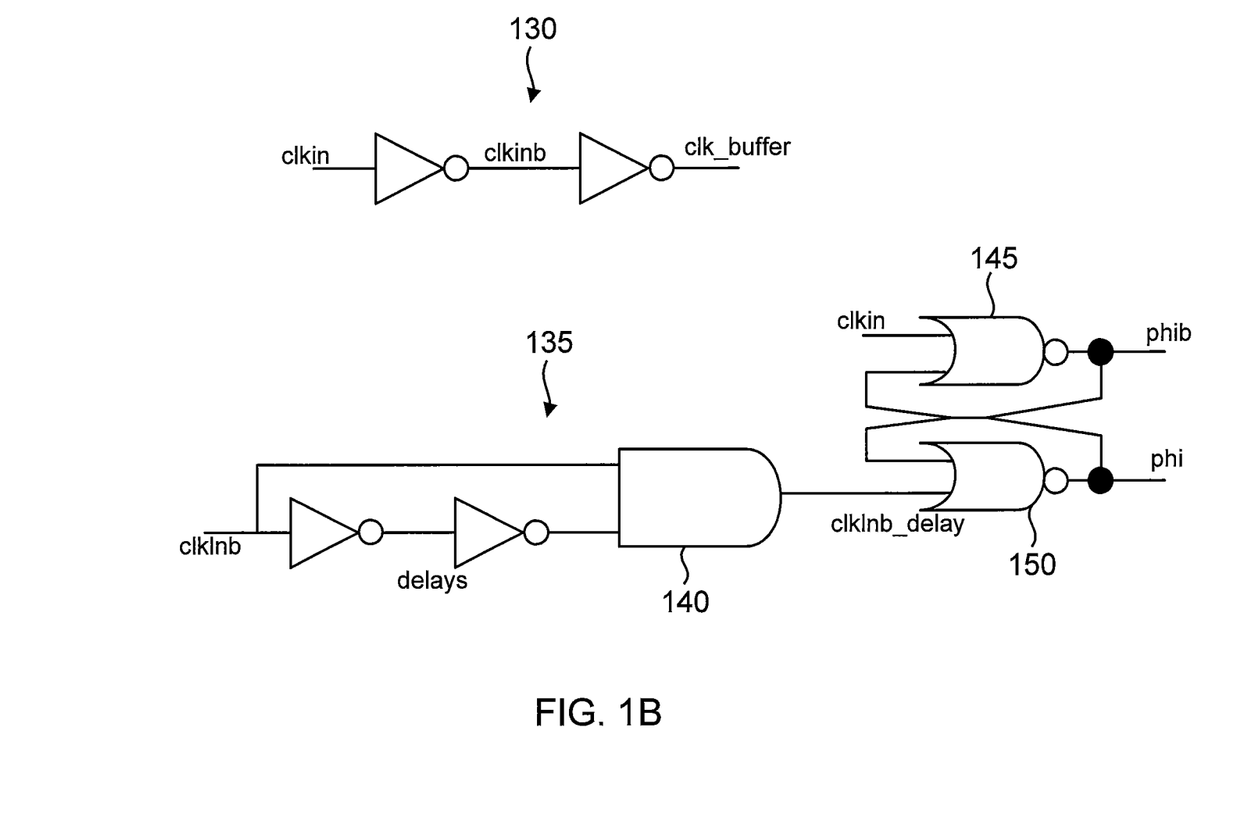
FIG. 1B illustrates the clock signal generation circuits for the first improved bootstrapped switch circuit of FIG. 1A.

In auxiliary loop circuit 110, a replica inverter formed by a serial combination of a PMOS transistor P3x and an NMOS transistor M10x functions as a replica of the second inverter in clock buffer 125 for main loop circuit. This replica inverter inverts the complement clock signal phib into a buffered clock signal driven onto a replica node bx. The replica node bx couples through a replica dummy NMOS transistor Mdx that is maintained on during normal operation by the signal enbuff in analogous fashion to dummy transistor Md in main loop circuit 105. When the complement clock signal phib goes high, the replica bootstrap voltage ckoutx will thus go low quickly due to the lack of loading in auxiliary loading circuit 110 from any bootstrapped switch transistor. Due to the delay from clock signal generator 135, the complement clock signal phib assertion is delayed with respect to the assertion of the buffered clock signal clk_buffer. The bootstrap voltage ckout is thus discharged prior to the discharge of the replica bootstrap voltage ckoutx to prevent any kick back from polluting the input voltage Vin. Note also that the discharge speed for the bootstrap voltage ckout is enhanced since the inverted clock signal bn drives the gate of third loop transistor Mp. The assertion of the buffered clock signal clk_buffer discharges the inverted clock signal bn to switch off third loop transistor Mp and prevent the positive terminal voltage signal bstcapp from slowing the discharge of the bootstrap voltage ckout. Third loop transistor Mp may thus comprise a thick-oxide device to protect it from voltage stress while the bootstrap voltage ckout is being discharged. Similarly, transistors M0, M1, Md, and Mdx may also be be thick-oxide transistors to protect them from the boosted voltages. The remaining transistors discussed herein may all be thin-oxide devices.

Figure 1C:
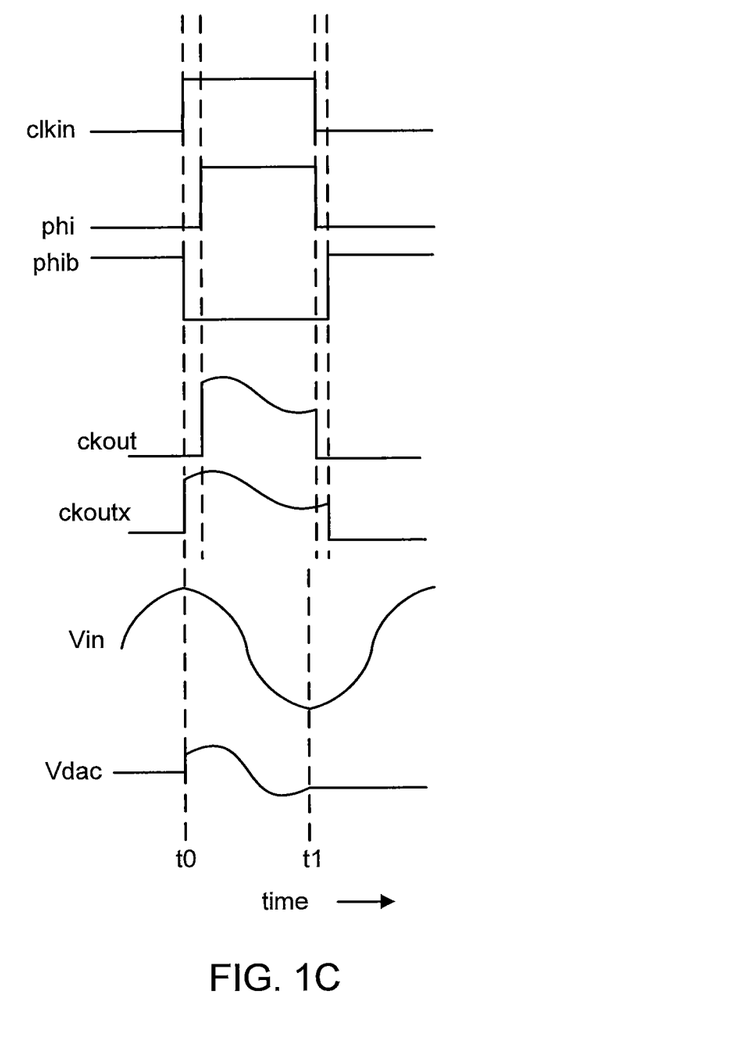
FIG. 1C is a timing diagram for various signals in the first improved bootstrapped switch circuit of FIG. 1A.

The resulting timing for the input clock signal clkin, the clock signal phi, the complement clock signal phib, the bootstrap voltage ckout, the replica bootstrap voltage ckoutx, the input voltage, and the sampled voltage Vdac are shown in FIG. 1C for a sampling period beginning at time t0 and ending at time t1. As discussed earlier, the bootstrap voltage ckout is discharged prior to the discharge of the replica bootstrapped voltage to prevent any kick back. The sampled voltage Vdac replicates the input voltage Vin but for an amplitude difference due to the constant conduction loss in bootstrapped switch transistor Min.

Figure 2A:
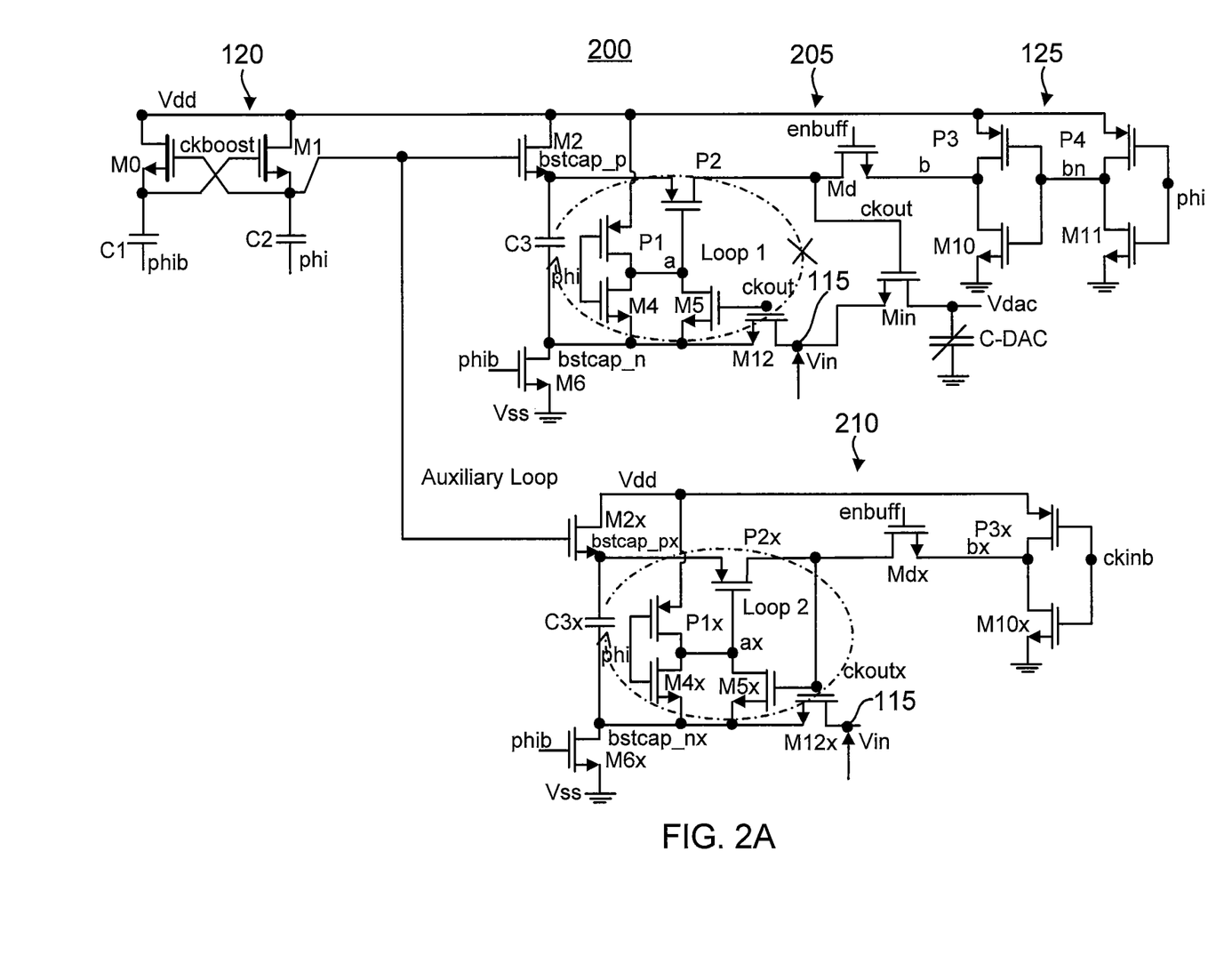
FIG. 2A illustrates a second improved bootstrapped switch circuit in accordance with an aspect of the disclosure.

The potential for kick back may not be problematic depending upon the input drive capability for the input voltage Vin. Third loop transistor Mp may then be eliminated as shown in FIG. 2A for a bootstrapped switch circuit 300. A main loop circuit 205 is constructed the same as discussed for main loop circuit 105 except for the omission of transistor Mp. Since kick back is no longer a problem, clock buffer 125 may be driven by the clock signal phi. An auxiliary loop circuit 210 is the same as discussed for auxiliary loop circuit 110 except that an inverted clock signal ckinb from clock buffer 130 replaces complement clock signal phib to drive the inverter formed by replica transistors P3x and M10x.

A loop (Loop 1) in main loop circuit 205 couples input node 115 through replica second loop transistor M12 to the negative terminal of the bootstrap capacitor C3. The loop continues through bootstrap capacitor C3 and first loop transistor P2 to the gate of bootstrapped switch transistor Min. A replica loop (Loop 2) in auxiliary loop circuit 210 couples from input node 115 through replica second loop transistor M12x to the negative terminal of replica bootstrap capacitor C3x. The replica loop continues through replica bootstrap capacitor C3x and replica first loop transistor P2x to the gate of replica second loop transistor M12x.

Figure 2B:
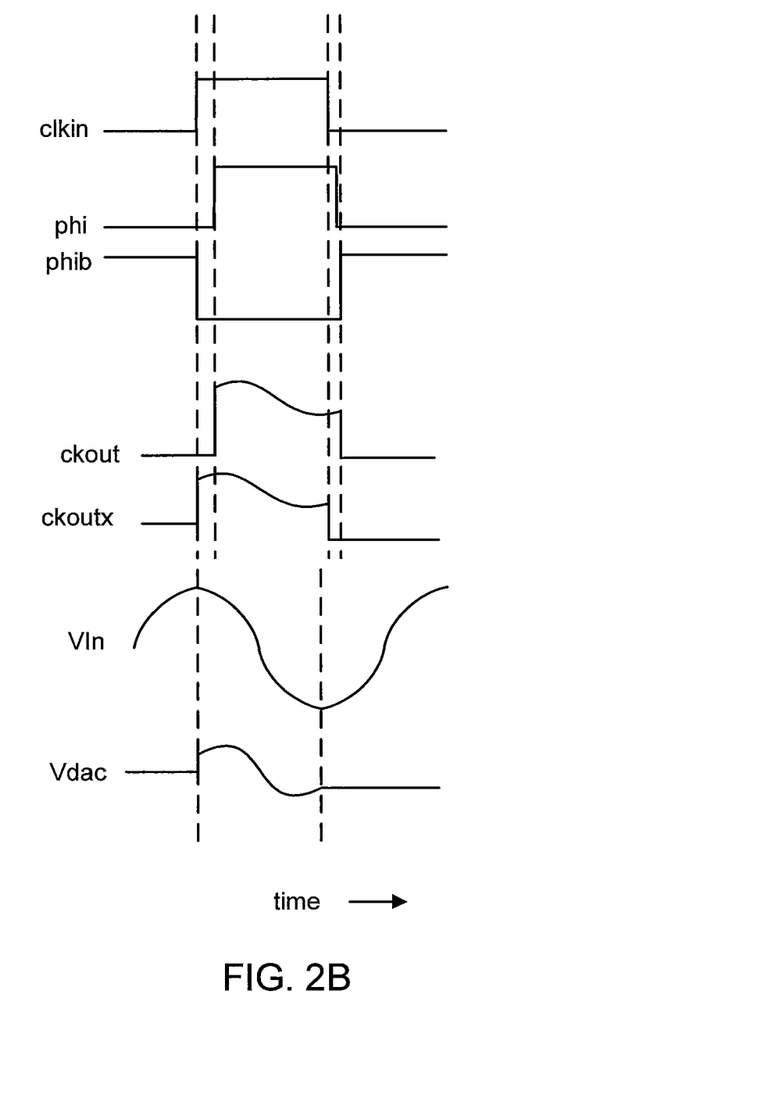
FIG. 2B is a timing diagram for various signals in the second improved bootstrapped switch circuit of FIG. 2A.

The resulting timing for the input clock signal clkin, the clock signal phi, the complement clock signal phib, the bootstrap voltage ckout, the replica bootstrap voltage ckoutx, the input voltage, and the sampled voltage Vdac for bootstrapped switch circuit 300 are shown in FIG. 2B for a sampling period beginning at time t0 and ending at time t1. The replica bootstrap voltage ckoutx is discharged prior to the discharge bootstrap switch voltage ckout. This discharge of the replica bootstrap voltage ckoutx switches off second loop transistor M12 so that bootstrapped switch transistor Min may be switched off more quickly.

Figure 3:
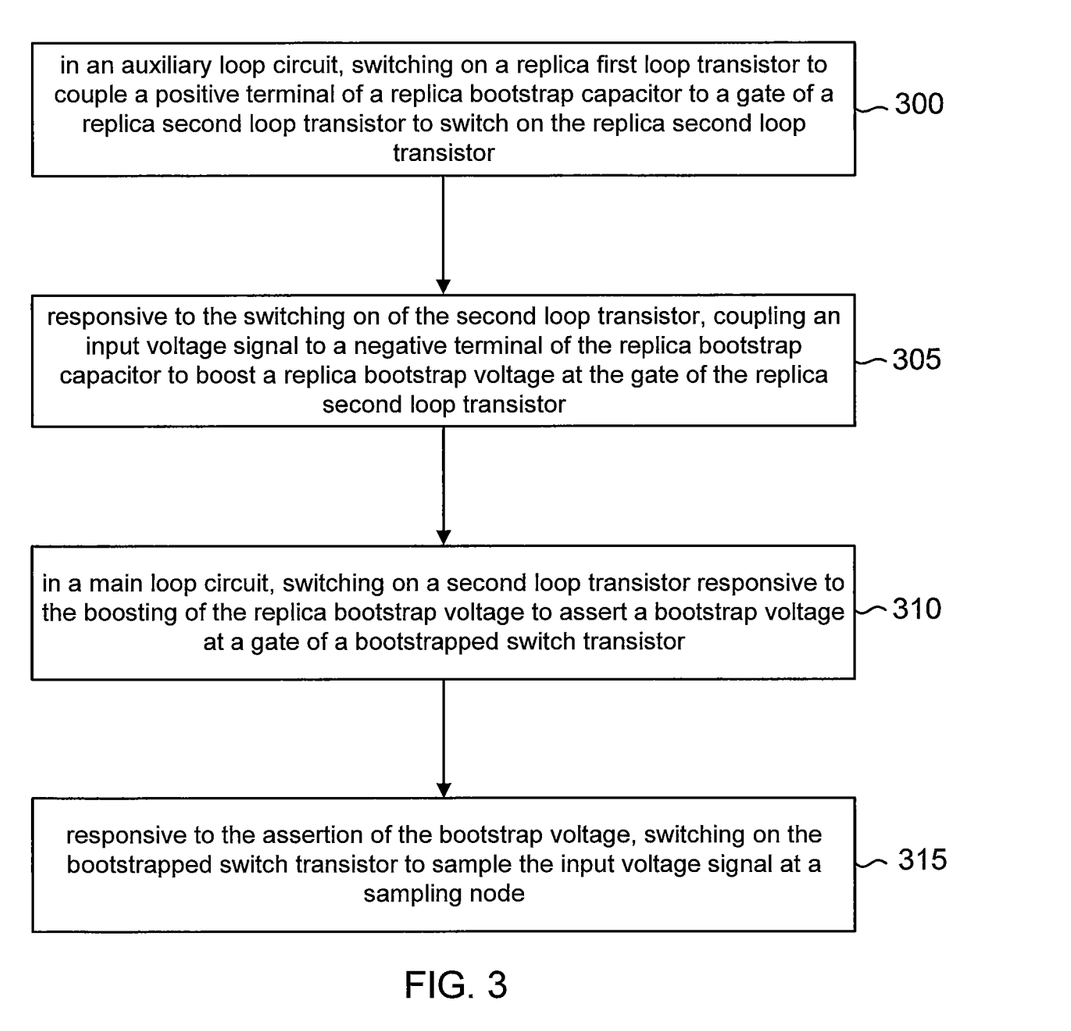
FIG. 3 is a flowchart of a method of operation for an improved bootstrapped switch circuit in accordance with an aspect of the disclosure.

A method of operation for an improved bootstrapped switch circuit as disclosed herein will now be discussed with regard to the flowchart of FIG. 3. The method includes an auxiliary loop circuit act 300 of switching on a replica first loop transistor to couple a positive terminal of a replica bootstrap capacitor to a gate of a replica second loop transistor to switch on the replica second loop transistor. The switching on of replica loop transistors P2x and M12x in auxiliary loop circuits 110 or 210 is an example of act 300. The method includes an act 305 that is responsive to the switching on of the second loop transistor and includes coupling an input voltage signal to a negative terminal of the replica bootstrap capacitor to boost a replica bootstrap voltage at the gate of the replica second loop transistor. The generation of the replica bootstrap voltage ckoutx in auxiliary loop circuits 110 or 210 is an example of act of 305.

The method further includes a main loop circuit act 310 of switching on a second loop transistor responsive to the boosting of the replica bootstrap voltage to assert a bootstrap voltage at a gate of a bootstrapped switch transistor. The assertion of the bootstrap voltage ckout in main loop circuits 105 or 205 is an example of act 310. Finally, the method includes an act 315 that is responsive to the assertion of the bootstrap voltage and includes switching on the bootstrapped switch transistor to sample the input voltage signal at a sampling node. The switching on of bootstrapped switch transistor Min in main loop circuits 105 or 205 is an example of act 315.

Figure 4:
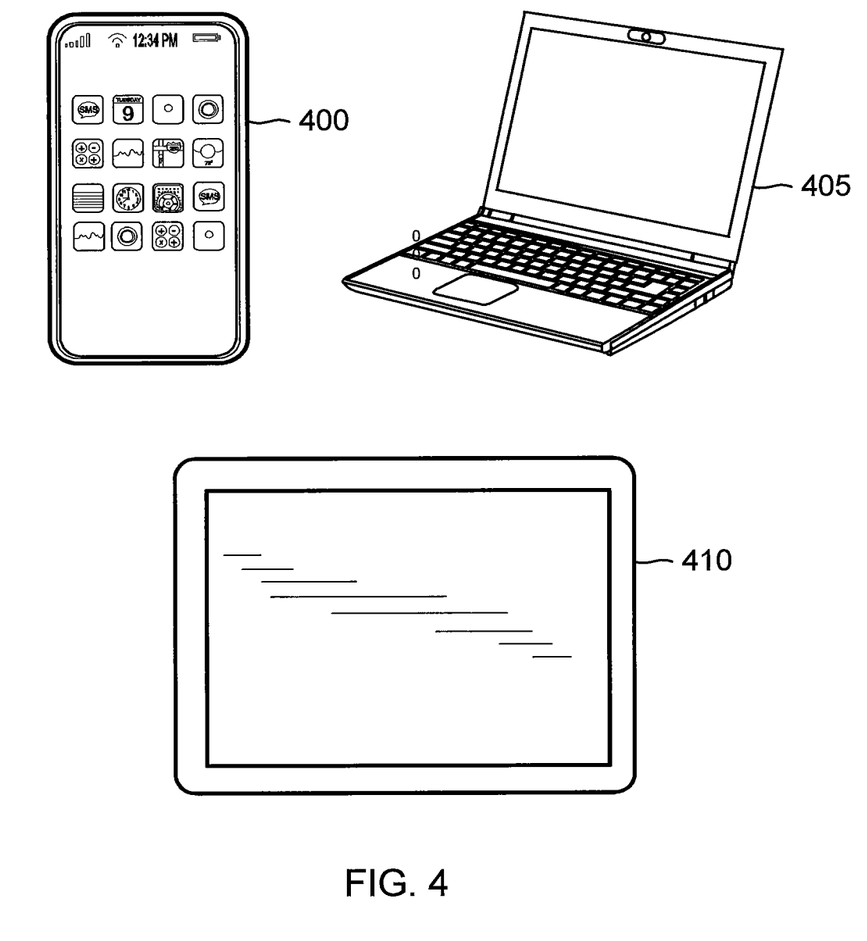
FIG. 4 illustrates some example electronic systems each incorporating a bootstrapped switch circuit in accordance with an aspect of the disclosure.

A bootstrapped switch circuit as disclosed herein may be incorporated into a wide variety of electronic systems. For example, as shown in FIG. 4, a cell phone 400, a laptop 405, and a tablet PC 410 may each include a bootstrapped switch circuit 200 or a bootstrapped switch circuit 300 in accordance with the disclosure. Other exemplary electronic systems such as a music player, a video player, a communication device, and a personal computer may also be configured with bootstrapped switch circuits constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A bootstrapped switch circuit comprising:
    a main loop circuit including:
        a bootstrap capacitor;
        a bootstrapped switch transistor coupled between a node for an input voltage signal and a sampling node for the input voltage signal;
        a first loop transistor coupled between a positive terminal of the bootstrap capacitor and a gate of the bootstrapped switch transistor; and
        a second loop transistor coupled between the node for the input voltage signal and a negative terminal of the bootstrap capacitor; and
    an auxiliary loop circuit configured to assert a replica bootstrap voltage for controlling a switching of the second loop transistor, wherein the auxiliary loop circuit comprises
        a replica bootstrap capacitor,
        a replica first loop transistor,
        a replica second loop transistor coupled between the node for the input voltage signal and a negative terminal of the replica bootstrap capacitor, wherein the replica first loop transistor is coupled between a positive terminal of the replica bootstrap capacitor and a gate of the replica second loop transistor,
        a first PMOS transistor having a source connected to a node of a power supply voltage, and
        a first NMOS transistor having a source connected to the negative terminal of the replica bootstrap capacitor and a drain connected to a drain of the first PMOS transistor, wherein the drain of the first PMOS transistor and the drain of the first NMOS transistor are both connected to a gate of the replica first loop transistor.

2. The bootstrapped switch circuit of claim 1, wherein the main loop circuit further includes a third loop transistor coupled between the first loop transistor and the gate of the bootstrapped switch transistor.

3. The bootstrapped switch circuit of claim 1, wherein the main loop circuit further includes an inverter configured to invert a clock signal to control a switching of the first loop transistor.

4. The bootstrapped switch circuit of claim 1, wherein the replica first loop transistor and the replica second loop transistor are both smaller than the first loop transistor and the second loop transistor.

5. The bootstrapped switch circuit of claim 1, wherein a node for a clock signal is connected to a gate for the first PMOS transistor and to a gate for the first NMOS transistor, the auxiliary loop circuit further including a second NMOS transistor having a drain connected to the gate of the first loop transistor and a source connected to the negative terminal of the replica bootstrap capacitor.

6. The bootstrapped switch circuit of claim 1, wherein the auxiliary loop circuit further includes an inverter configured to discharge the replica bootstrap voltage.

7. The bootstrapped switch circuit of claim 6, wherein the main loop circuit is configured to discharge the bootstrap voltage prior to the discharge of the replica bootstrap voltage.

8. The bootstrapped switch circuit of claim 6, wherein the main loop circuit if configured to discharge the bootstrap voltage after the discharge of the replica bootstrap voltage.

9. The bootstrapped switch circuit of claim 1, wherein the sampling node is a terminal of a capacitor for a digital-to-analog-converter.

10. The bootstrapped switch circuit of claim 1, wherein the bootstrapped switch circuit is incorporated into a cellular telephone.

11. The bootstrapped switch circuit of claim 1, further comprising:
   a switched capacitor circuit configured to control a charging of the bootstrap capacitor.

12. The bootstrapped switch circuit of claim 11, wherein the switched capacitor circuit is further configured to control a charging of a replica bootstrap capacitor in the auxiliary loop circuit.

\* \* \* \* \*